United States Patent [19]
Lee

[11] Patent Number: 5,986,917
[45] Date of Patent: Nov. 16, 1999

[54] WAFER BURN-IN TEST CIRCUIT FOR A SEMICONDUCTOR MEMORY DEVICE

[75] Inventor: Yun-Sang Lee, Seongnam, Rep. of Korea

[73] Assignee: Samsung Electronics, Cp. Ltd., Suwon, Rep. of Korea

[21] Appl. No.: 08/996,806

[22] Filed: Dec. 23, 1997

[30] Foreign Application Priority Data

Dec. 23, 1996 [KR] Rep. of Korea ............ 96-70532

[51] Int. Cl.$^6$ ................................ G11C 17/00
[52] U.S. Cl. ................ 365/96; 365/201; 365/230.06
[58] Field of Search .............. 365/201, 230.01, 365/230.06, 191, 185.23, 189.05

[56] References Cited

U.S. PATENT DOCUMENTS 5,590,079  12/1996  Lee et al. ......................... 365/201
5,638,331   6/1997  Cha et al. ......................... 365/201
5,654,930   8/1997  Yoo et al. ......................... 365/222

Primary Examiner—David Nelms
Assistant Examiner—Thong Le
Attorney, Agent, or Firm—Marger Johnson & McCollom, P.C.

[57] ABSTRACT

A semiconductor memory device has independently controllable word lines, thereby allowing various background data patterns to be freely written to the memory cells to perform various wafer burn-in tests. This allows the leakage between adjacent memory cells to be efficiently tested by independently controllable word line activation signals, as well as the reliability of bit lines. A wafer burn-in test circuit for performing this improved burn-in test improves the reliability of the device by performing a level transition on the signals that drive the sub word line drivers, thereby eliminating the need to apply a high voltage to one transistor in the sub word line driver.

20 Claims, 9 Drawing Sheets

WAFER BURN-IN TEST CIRCUIT FOR A SEMICONDUCTOR MEMORY DEVICE

This application corresponds to Korean patent application No. 96-70532 filed Dec. 23, 1996 in the name of Samsung Electronics Co., Ltd. which is herein incorporated by reference for all purposes.

BACKGROUND OF THE INVENTION

1. Field of the Invention

This invention relates generally to wafer burn-in test circuits for semiconductor memory devices, and more particularly, to a wafer burn-in test circuit for sensing a cell failure in the wafer state.

2. Description of the Related Art

To guarantee the reliability of a semiconductor chip, a burl-in test is carried out after the wafer fabricating process is completed. Burn-in tests are generally performed after assembly when the chip is in a packaged state. Failed chips are discarded after the burn-in test is completed. However, this results in unnecessary expenditures of time and costs on assembling and testing failed chips.

Most failures in a dynamic random access memory (DRAM) are single-bit failures. Hence, in order to sense the failures, screening must be performed for a relatively long time. Single-bit failures are directly related to leakage current in imperfect memory cells. Leakage current is generated by failures in the transmission gate oxide layer, the capacitor dielectric layer, the storage node junction, etc.

In a conventional burn-in test implemented at the package state, the supply efficiency of a stress voltage supplied to the memory cell is very low because one word line is selected per thousands of cycles (for example, 4096 or 8192 cycles in a 64 Megabit DRAM). As the integration level of semiconductor memory devices increases, the supply efficiency of this stress voltage is reduced. In order to reduce burn-in test time and to improve the supply efficiency of the stress voltage, a method for simultaneously selecting all the word lines has been developed. By implementing this method at a wafer state, the yield is improved and production costs are reduced.

FIG. 1 is a block diagram illustrating a prior art semiconductor memory device having a sub word line driver. Referring to FIG. 1, memory cell arrays 101A and 101B include a plurality of unit memory cells. Word lines WL0–WL3 are connected to the memory cells and to corresponding sub word line drivers 102. A global word line enable signal NWE generated by a row decoder 103 is supplied to the sub word line driver 102 to activate the entire word lines WL0–WL3.

The basic operating principle of a wafer state burn-in test used with the prior art circuit of FIG. 1 will now be described. If an external wafer burn-in activation signal WBE, which indicates that the wafer burn-in mode has started, is applied to an additional test pad, control signals CON_A and CON_B are applied to the switching circuits of FIGS. 2A and 2B, respectively. The switching circuit of FIG. 2A consists of an NMOS transistor 201 having a channel connected between an input terminal to which a high voltage VPP is applied and a line WBEVSS_0 and having a gate connected to the control signal CON_A, and a PMOS transistor 202 having a channel connected between a ground terminal and the line WBEVSS_0 and having a gate connected to the control signal CON_A. The switching circuit of FIG. 2B consists of an NMOS transistor 203 having a channel connected between the input terminal to which the high voltage VPP is applied and a line WBEVSS_E and having a gate connected to the control signal CON_B, and a PMOS transistor 204 having a channel connected between the ground terminal and the line WBEVSS_E and having a gate connected to the control signal CON_B.

These switching circuits provide different signals depending on whether the device is in a normal mode of operation or a wafer burn-in test mode of operation. The control signals CON_A and CON_B can be selectively activated by the user and are received through the pad. For example, if the control signal CON_A having a logic "HIGH" level is applied to the switching circuit, the high voltage signal VPP is applied to the odd word lines WL1 and WL3 through the line WBEVSS_0. All of the word lines WL1 and WL3 which correspond to sub word line drivers 102 which use the same line WBEVSS_0 receive the VPP signal.

If the control signal CON_B is activated, the high voltage signal VPP is supplied to the sub word line drivers 102 through the line WBEVSS_E to operate the word lines WL0 and WL2. Therefore, the memory cells connected to the word lines WL0 and WL2 are turned on to read or write data. If both of the control signals CON_A and CON_B are simultaneously operated, all of the memory cells connected to the word lines WL0–WL3 are turned on.

Data is written into the memory cell connected to the word line activated by the above-described operation through an additional data line. The circuit of FIG. 1 has a data pattern as shown in FIG. 7A after data is written into the memory cells.

FIG. 3 is a block diagram of another prior art semiconductor memory device showing the connection relationship between the sub word line drivers and the word lines. FIG. 3 is similar to FIG. 1. However, the sub word line driver 102 connected to a line WBEVSS_T is coupled to the word lines WL1 and WL2, and the sub word line driver 102 connected to a line WBEVSS_C is coupled to the word lines WL0 and WL3.

Switching circuits for supplying the high voltage signal VPP to the lines WBEVSS_T and WBEVSS_C shown in FIG. 3 are illustrated in FIGS. 4A and 4B. The switching circuit of FIG. 4A consists of an NMOS transistor 401 having a channel connected between the input terminal to which the high voltage VPP is applied and the line WBEVSS_T and having a gate connected to the control signal CON_A, and a PMOS transistor 402 having a channel connected between the ground terminal and the line WBEVSS_T and having a gate connected to the control signal CON_A. The switching circuit of FIG. 4B has the same configuration as that of FIG. 4A except that it is controlled by the control signal CON_B instead of CON_A.

The circuit of FIG. 3 has a data pattern as shown in FIG. 7B after data is written into the memory cells.

FIG. 5 illustrates a prior art global word line driving circuit which the global word line enable signal NWE for activating the word lines WL0–WL3. The circuit of FIG. 5 drives the signal NWE to a logic "LOW" level in response to a signal PDPXi, which is enabled when a row address strobe signal /RAS is deactivated to a logic "HIGH" level. The circuit of FIG. 5 drives the global word line enable signal NWE to a logic "HIGH" level when a row decoding signal RAi is activated. The global word line enable signal NWE is a signal The global word line driving circuit of FIG. 5 includes a PMOS transistor 501 having a channel connected between a power voltage VCC and a node N1 and having a gate connected to the signal PDPXi, a PMOS transistor 502 having a channel connected between the power voltage VCC and the node N1, an inverter 504 connected between the node N1 and the global word line enable signal NWE, and an NMOS transistor 503 having a channel connected between the node N1 and the ground terminal and having a gate connected to the row decoding signal RAi.

FIG. 6 illustrates the sub word line driver 102 of FIGS. 1 and 3. The sub word line driver includes an NMOS transistor 602 having a channel connected between the global word line enable signal NWE and a node N2 and having a gate connected to a word line activation signal PXiD_i, an NMOS transistor 603 having a channel connected between a signal PXiD_P and the node N2, an NMOS transistor 601 having a channel connected between a gate of the NOS transistor 603 and the global word line enable signal NWE and having a gate connected to the power voltage VCC, and an NMOS transistor 604 having a channel connected between the node N2 and a line WBEVSS and having a gate connected to a signal /PXi.

When forming the data pattern shown in FIG. 7A through the above circuits, one type of data can be written to a selected memory cell, while the opposite data can be written to the memory cell adjacent the selected memory cell. Therefore, the chip can be tested for its ability to withstand stress between the adjacent memory cells.

However, a problem with the circuit of FIG. 1 is that, when the data pattern of FIG. 7A is formed, the ability to withstand bit line stress generated by a sensing operation can not be tested because the written data form can not perform the sensing operation. That is, since the opposite data is written in a pair of the same bit lines BL and /BL, it is difficult to determine whether there is a failure.

A problem with the circuit of FIG. 3 is that, when forming the data pattern shown in FIG. 7B, some of the data written in adjacent memory cells are opposite to each other, and some of data is the same. Hence, the chip can not be tested for its ability to withstand stress between the adjacent memory cells that have the same data in adjacent memory cells. That is, since the same data is written on the word lines WL1 and WL2, the stress between adjacent memory cells can not be tested. In this structure, it is difficult to perform the various stress tests for reliability.

Another problem with the prior art is that, in the sub word line drivel of FIG. 6, in order to obtain a sufficient word line activation level, the high voltage VPP is applied through the line WBEVSS to the word line WL by operation of the NMOS transistor 604. Therefore, the signal /PXi, which is applied to the gate of NMOS transistor 604, should be higher than the high voltage VPP. This, however, tends to cause break down in the NMOS transistor 604.

Accordingly, a need remains for a technique for a method and apparatus which overcomes the above mentioned problems when performing a wafer burn-in test on a semiconductor memory device

SUMMARY OF THE INVENTION

It is therefore an object of the present invention to provide a wafer burn-in test circuit for a semiconductor memory device which can form various background write patterns.

It is another object of the present invention to provide a wafer burn-in test circuit for a semiconductor memory device which can perform a write operation through a sub word line independently connected to each word line.

It is still another object of the present invention to provide a wafer burn-in test circuit for a semiconductor memory device which call prevent the overload of a transistor to which a high voltage is applied.

It is a further object of the present invention to provide a wafer burn-in test circuit for a semiconductor memory device which can test reliability by using an alternating current (AC) stress.

To accomplish these and other objects, a semiconductor memory device constructed in accordance with the present invention has independently controllable word lines, thereby allowing various background data patterns to be freely written to the memory cells to perform various wafer burn-in tests. This allows the leakage between adjacent memory cells to be efficiently tested by independently controllable word line activation signals, as well as the reliability of bit lines. A wafer burn-in test circuit for performing this improved burn-in test improves the reliability of the device by performing a level transition on the signals that drive the subword line drivers, thereby eliminating the need to apply a high voltage to one transistor in the subword line driver.

One aspect of the present invention is a wafer burn-in test circuit for a semiconductor memory device having a plurality of memory cells and a plurality of word lines connected to said memory cells, comprising: an first buffer for generating an internal wafer burn-in enable signal in response to an external wafer burn-in enable signal; a second buffer coupled to the first buffer for providing a plurality of corresponding row decoding signals in response to said internal wafer burn-in enable signal and to a plurality of row addresses; and a plurality of sub word line drivers coupled to the second buffer for supplying a plurality of word line activation signals to said corresponding word lines in response to a global word line activation signal, wherein the level of said word line activation signal is changed by the combination of said row decoding signals.

The second buffer can include: a row address controller coupled to said first buffer for generating pulses in response to said internal wafer burn-in activation signal and to said row addresses; and a third buffer coupled to said row address controller for generating said row decoding signals in response to said first pulses and to a decoded internal address.

The row address controller can include: a first plurality of logic gates, each gate having a first input terminal coupled to receive said internal wafer burn-in activation signal and a second input terminal coupled to receive one of said row addresses; and a plurality of inverters, each inverter having an input terminal coupled to the output terminals of one of said first plurality of logic gates.

The third buffer can include: a second plurality of logic gates, each gate having a first input terminal coupled to receive one of said pulses and a second input terminal coupled to receive one of said decoded internal address; and a second plurality of inverters, each inverter having an input terminal coupled to the output terminals of one of said second plurality of logic gates.

Another aspect of the present invention is a wafer burn-in test circuit for a semiconductor memory device having a plurality of memory cells and word lines connected to the memory cells includes an input buffer for generating an internal wafer burn-in enable signal of a CMOS level in response to an external wafer burn-in enable signal supplied through a test pad, a row address buffer for providing corresponding row decoding signals in response to the internal wafer burn-in enable signal and to a plurality of row addresses supplied from an address pad, and a sub word line driver for supplying a word line activation signal to the corresponding word lines in response to the word line activation signal having a level changed by the combination of the row decoding signals and to a global word line activation signal.

The foregoing and other objects, advantages and features of the present invention will become more apparent from the following detailed description with reference to the accompanying drawings, in which like reference numerals or symbols designate like elements.

DETAILED DESCRIPTION

Figure 8:
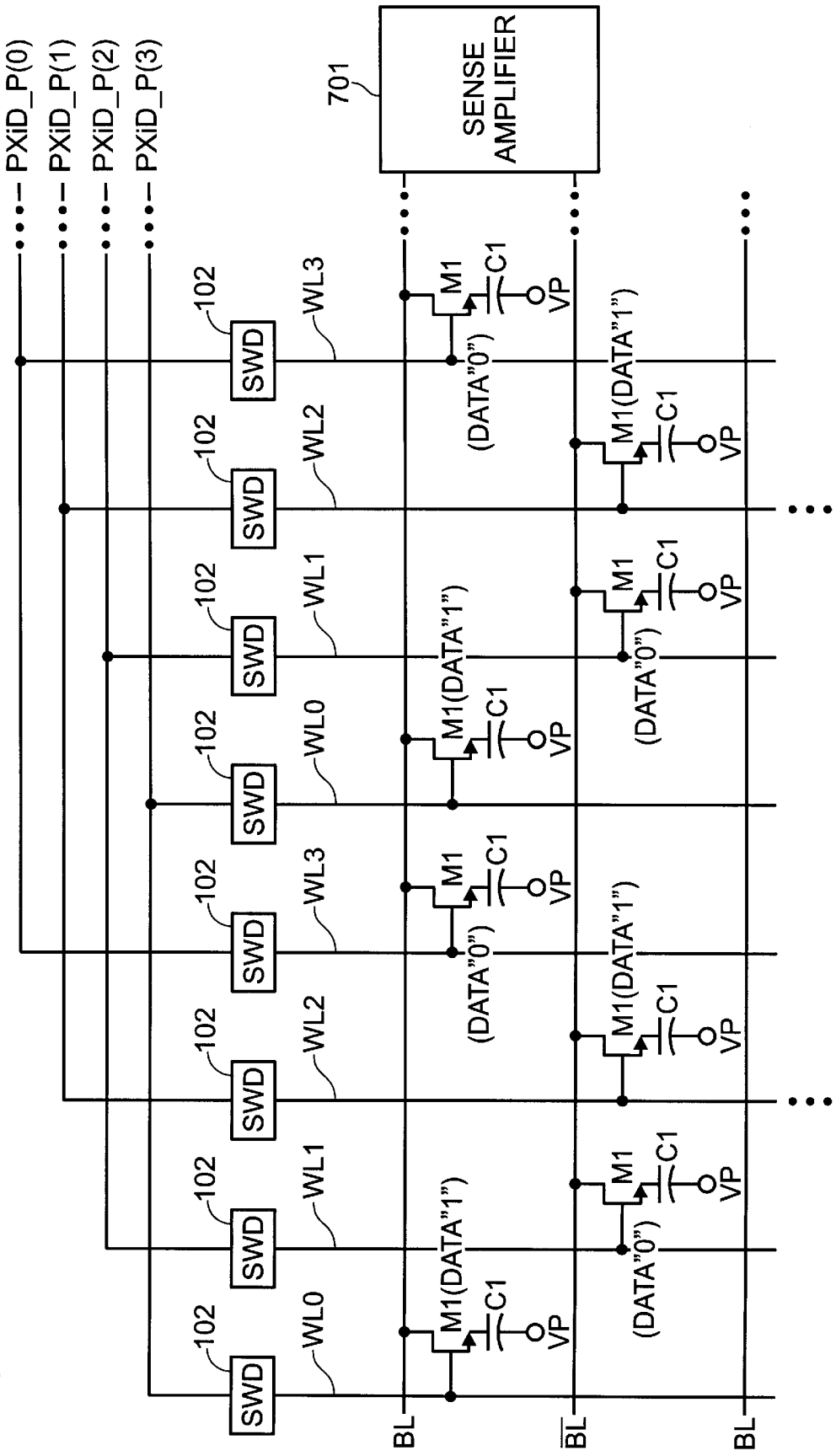
FIG. 8 shows signal lines in a semiconductor memory device which are required to form a data pattern according to the present invention.

FIG. 8 is a schematic diagram of an embodiment of a circuit for testing a memory cell at a wafer state in accordance with the present invention. Refining to FIG. 8, word lines WL0–WL3 are connected to corresponding word line activation signals PXiD_P(3)–PXiDP(0) through sub word line drivers (SWD) 102. Each NMOS transistor M1, which form unit memory cells, is connected to an intersecting point of the word lines WL0–WL3 and a bit line. A capacitor C1 is connected between the source terminal of each of the NMOS transistors M1 and a terminal to which a plate voltage VP is applied. A bit line sense amplifier 701, which reads weak data signals, is connected between a pair of bit lines BL and /BL. The word line activation signals PXiD_P(0)–PXiDP(3) are high voltage signals that are applied to the corresponding word lines WL0–WL3, respectively.

FIGS. 9A through 9D are schematic diagrams of embodiments of peripheral circuits in accordance with the present invention which are required to activate the word lines in FIG. 8 through the sub word line drivers.

Figure 9A:
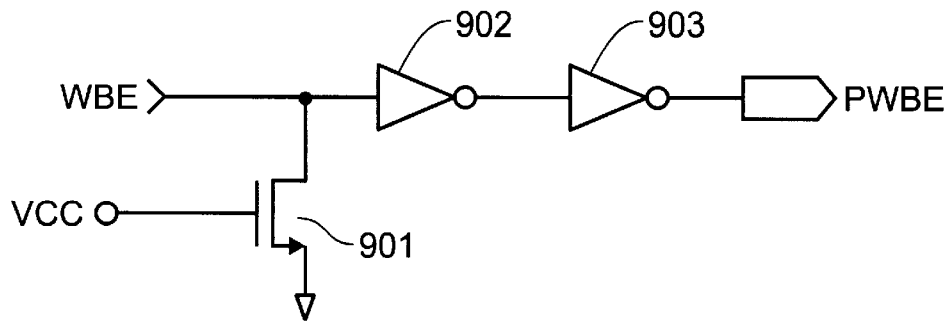
FIGS. 9A–9D are circuit diagrams showing peripheral circuits required to activate a word line through a sub word line driver according to the present invention.

FIG. 9A shows an embodiment of an input buffer for providing the internal wafer burn-in activation signal PWBE at a CMOS level in accordance with the present invention. The circuit of FIG. 9A includes an NMOS transistor 901 having a channel connected between a test pad and a ground terminal. Inverters 902 and 903 are connected in series between the test pad and the internal wafer burn-in activation signal PWBE. When an external wafer burn-in activation signal WBE, which is supplied at the test pad, is activated, the input buffer receives this external wafer burn-in activation signal WBE and generates an internal wafer burn-in activation signal PWBE at a CMOS logic level.

Figure 9B:
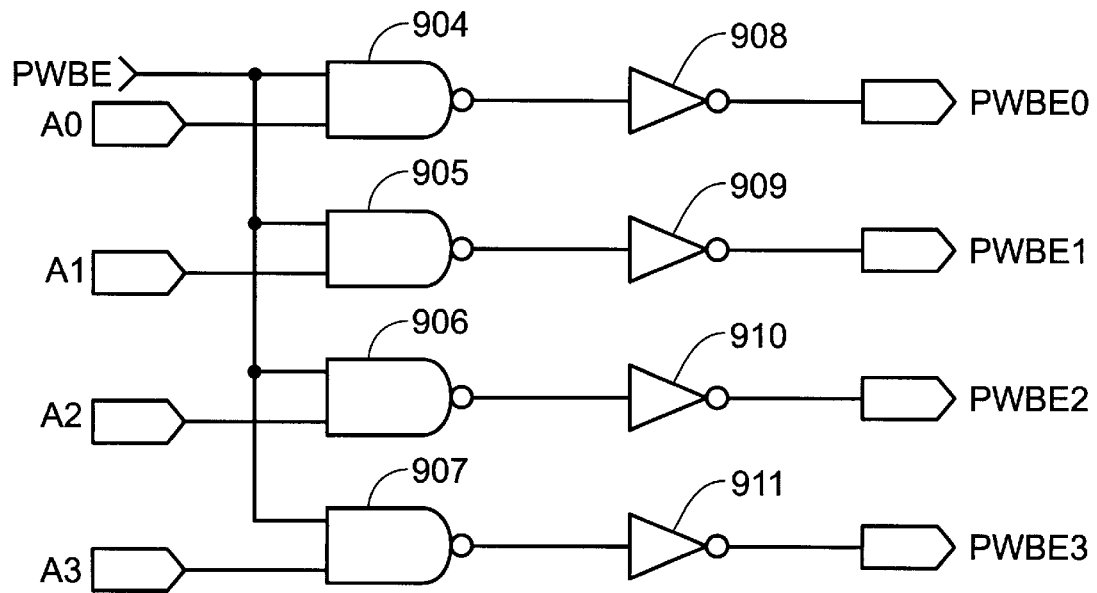
Figure 9C:
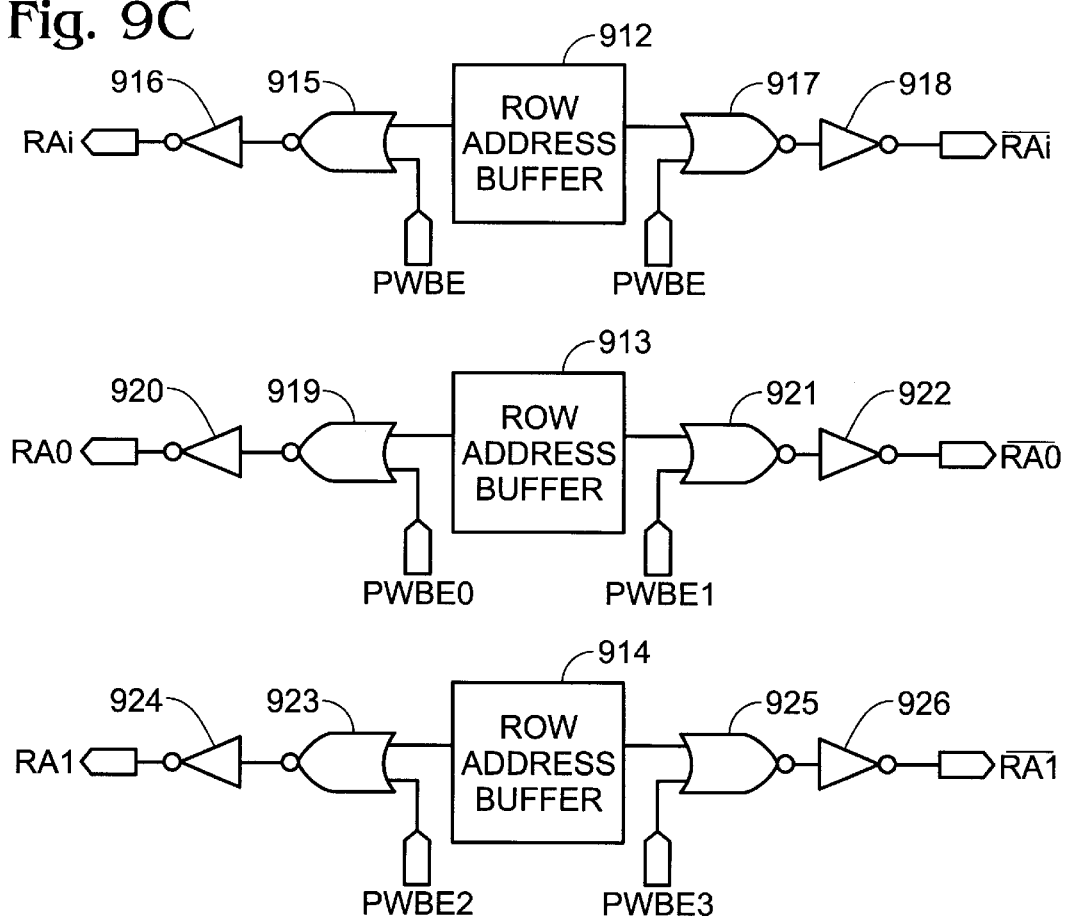

FIG. 9B shows an embodiment of a row address controller in accordance with tile present invention. FIG. 9C shows an embodiment of buffer circuitry for generating row decoding signals in accordance with the present invention. Together, the circuits of FIGS. 9B and 9C form a row address buffer.

The circuit of FIG. 9B includes four NAND gates 904–907 and foul inverters 908–911. Each of the NAND gates a first input terminal for receiving the internal wafer burn-in activation signal PWBE, and a second input terminal for receiving one of the address signals A0–A3. The input terminal of each of inverters 908–911 is connected to the output terminal of one of the NAND gates 904–907, respectively. This row address controller generates pulses in the signals PWBE0–PWBE3 for controlling each word line. As indicated in FIG. 10, which is described in more detail below, a pulse PXiD_P can be selectively supplied to each word line in response to the combination of the address signals A0–A3 applied from an address pad.

Referring to FIG. 9C, each of the two-input NOR gates 919 and 921 receive a decoded internal address signal generated from a row address buffer 913 at one of its input terminals and the pulse signals PWBE0 and PWBE1, respectively, at its other input terininal. Inverters 920 and 922 each has an input terminal connected to the Output terminal of the NOR gates 919 and 921, respectively, for generating row decoding signals RA0 and /RA0, respectively. Similarly, NOR gates 923 and 925 receive a signal generated from a row address buffer 914 and the pulses PWBE2 and PWBE3, and inverters 924 and 925 connected to the output terminals of the NOR gates 923 and 925 to generate row decoding signals RA1 and /RA1, respectively. Also in a similar manner, NOR gates 915 and 917 receive a signal generated from a row address buffer 912 and pulses PWBE, and inverters 924 and 925 connected to the output terminals of the NOR gates 915 and 917 to generate row decoding signals RAi and /RAi, respectively, which are for activating other word lines other than the word lines WL0–WL3.

Figure 9D:
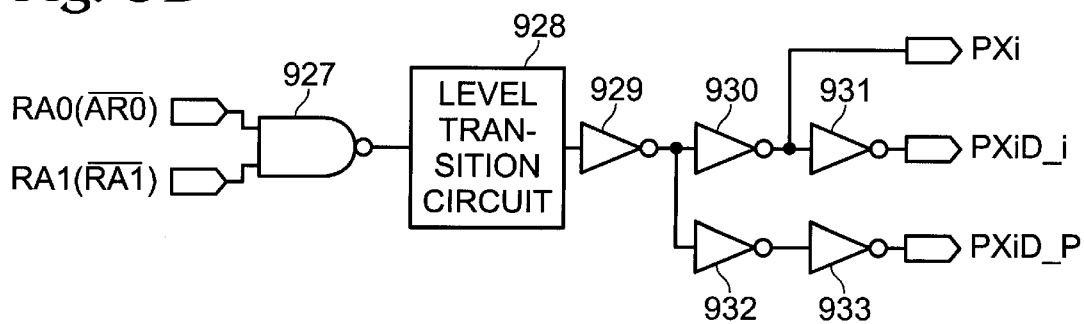

FIG. 9D shows an embodiment of a circuit for generating signals that drive the sub word line drivers 102 in response to the row decoding signals in accordance with the present invention. Referring to FIG. 9D, a NAND gate 927 receives the row decoding signals RA0 (or /RA0) and RA1 (or /RA1). A level transition circuit 928 receives the output of the NAND gate 927 and raises the level of the input signal to output a high voltage level signal. An inverter 929 has an input terminal is connected to output terminal of the level transition circuit 928. Inverters 930 and 931 are connected in series with the input of inverter 930 connected to the output of the inverter 929. Inverter 932 and 933 are connected in series with the input of inverter 932 connected to the output of the inverter 929. A signal /PXi is generated at the output terminal of the inverter 930, the signal PXiD_i is generated at the output of inverter 931, and the signal PXiD_P is generated at the output of inverter 933.

Figure 10:
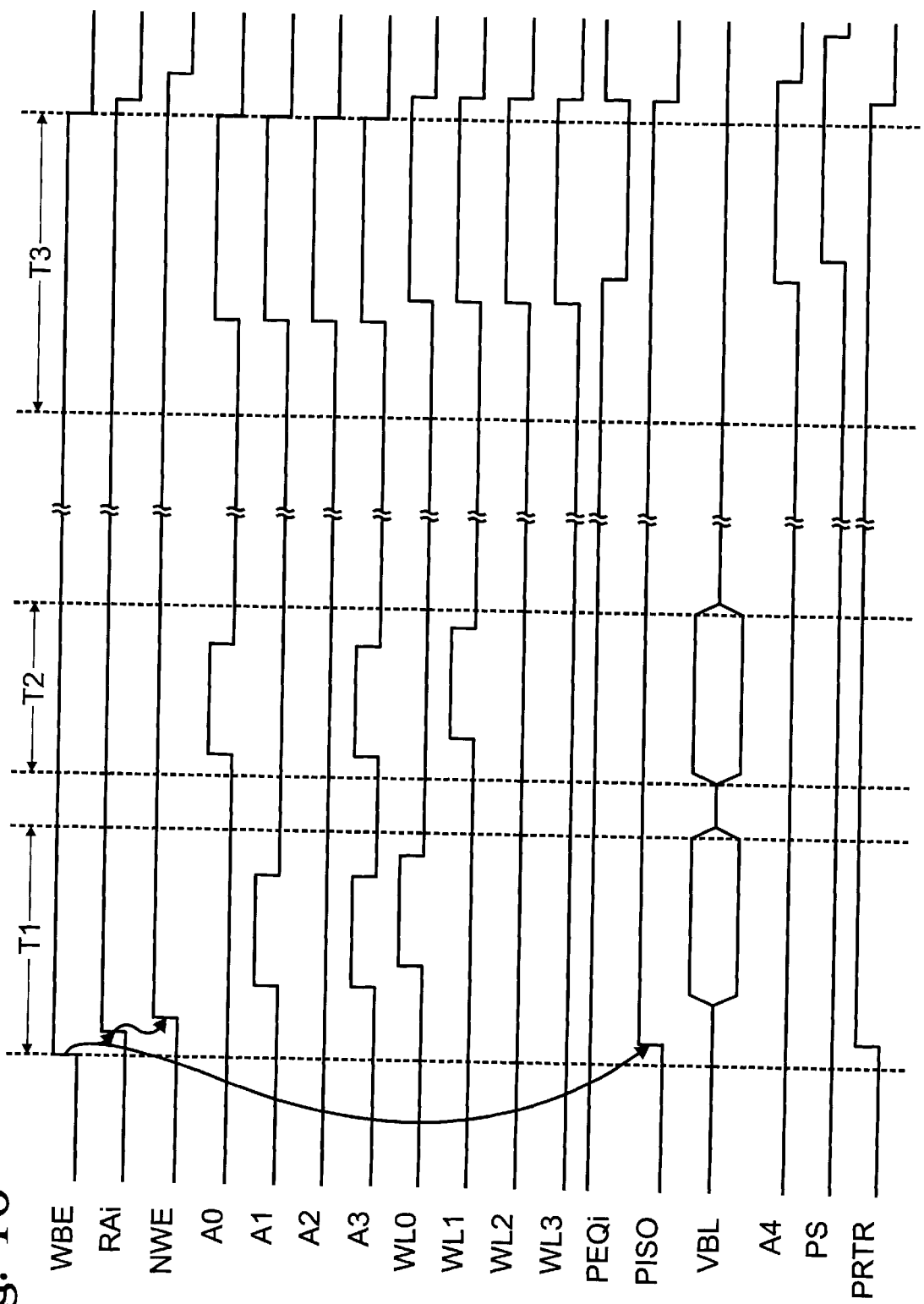
FIG. 10 is a timing chart showing signals required for a wafer burn-in test according to the present invention.

FIG. 10 is a timing chart showing signals required for a wafer burn-in test according to the present invention. Referring to FIG. 10, WBE is an external PAD signal for initiating the wafer burn-in test. RA corresponds the RAi signal of FIG. 9C, where the RAi signal is the output signal of the address buffer for selecting the global word line. For example, if the number of total row addresses is 13, the value of "i" corresponds to 2 through 12. The second and third RA0 and RA1 as shown in FIG. 9C are address buffers for selecting the section word line such that RA0 has an "i" value 0 of zero and RA1 has an "i" value of one.

Referring again to FIG. 10, A0–A3, which are the input signals to FIG. 9B, are external PAD signals for selecting PWBE0 through PWBE3 during wafer burn-in. PEQI is a bit equalization line signal. PISO is a block isolation line signal. VBL is the PAD signal for writing data during wafer burn-in. A4 is the PAD signal for changing from write mode to read mode during wafer burn-in. PRTR is a signal used for enabling cell redundancy. Finally, PS is a sense enable signal.

Figure 1:
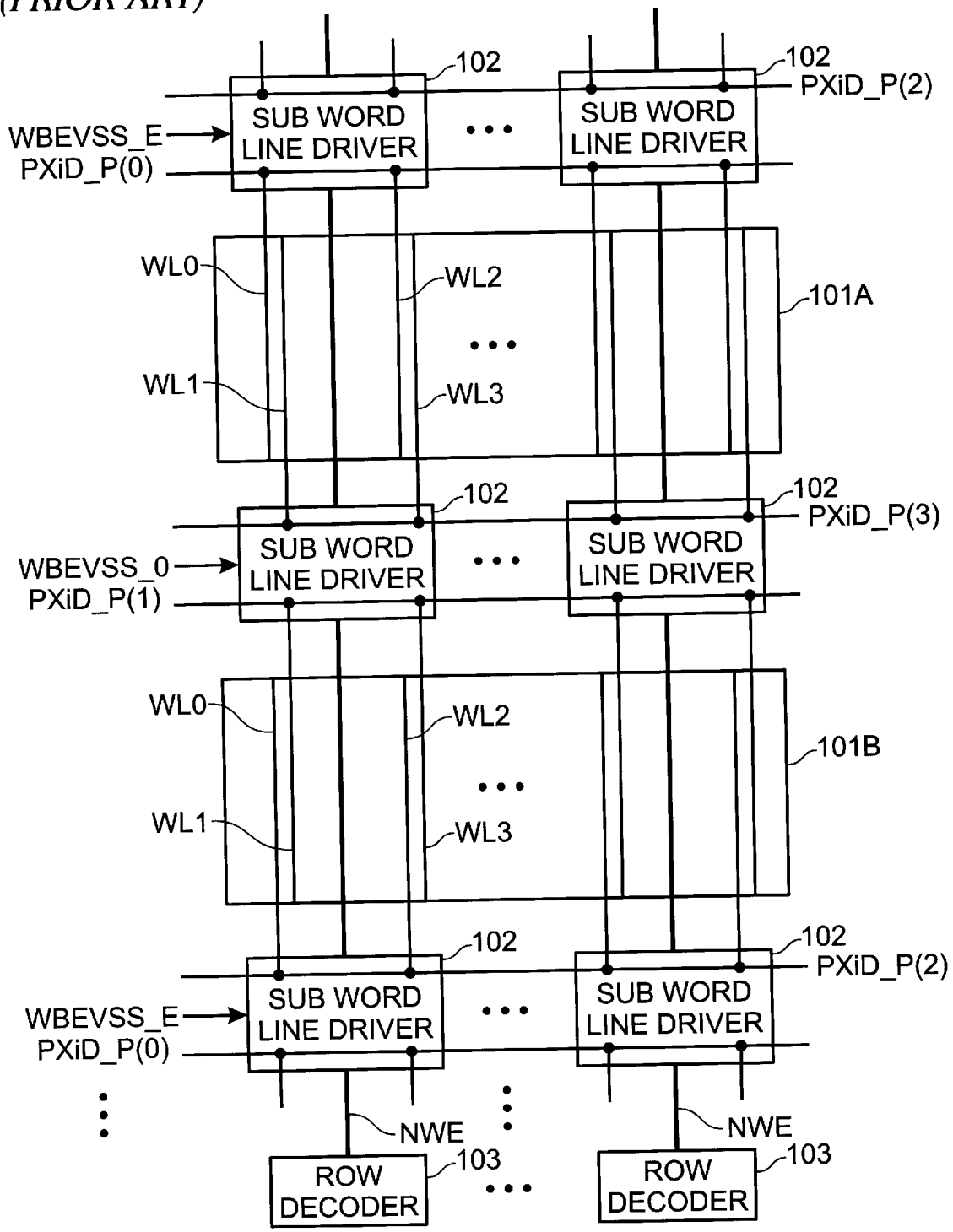
FIG. 1 is a block diagram of a prior art semiconductor memory device showing the connection relationship between sub word line drivers and word lines.
Figure 2A:
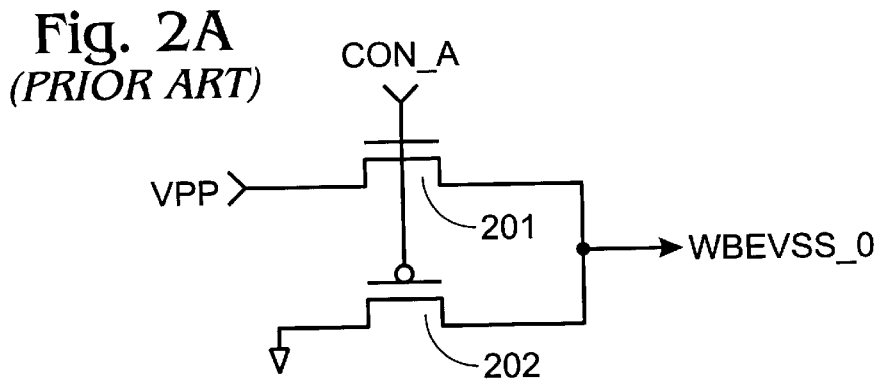
FIGS. 2A and 2B are circuit diagrams showing high voltage switching circuits used with the circuit of in FIG. 1.
Figure 2B:
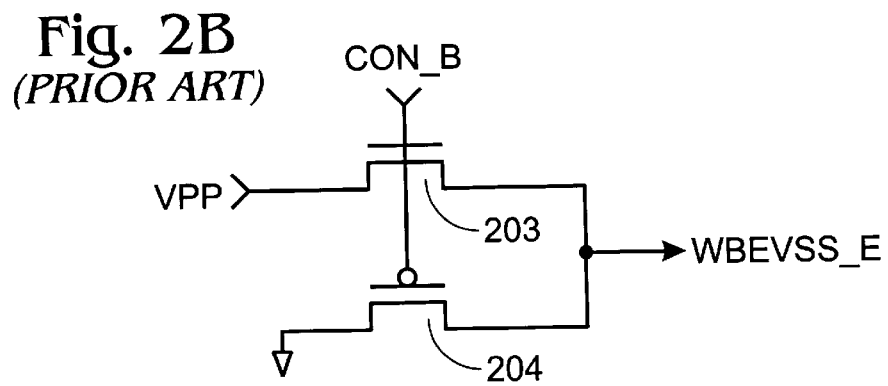
Figure 4A:
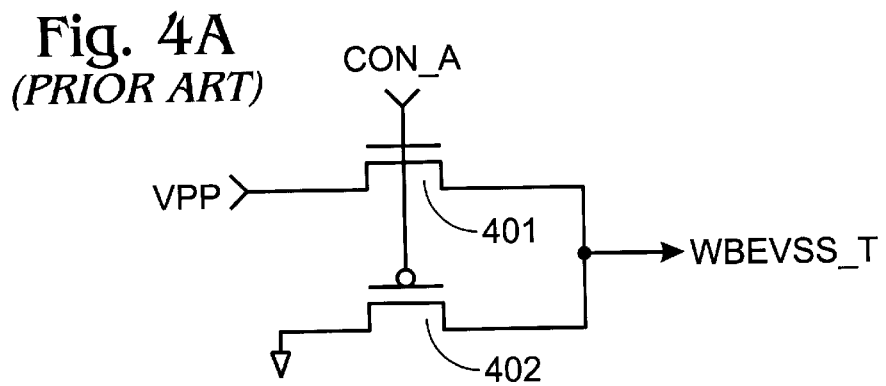
FIGS. 4A and 4B are circuit diagrams showing high voltage switching circuits used with the circuit of FIG. 3.
Figure 4B:
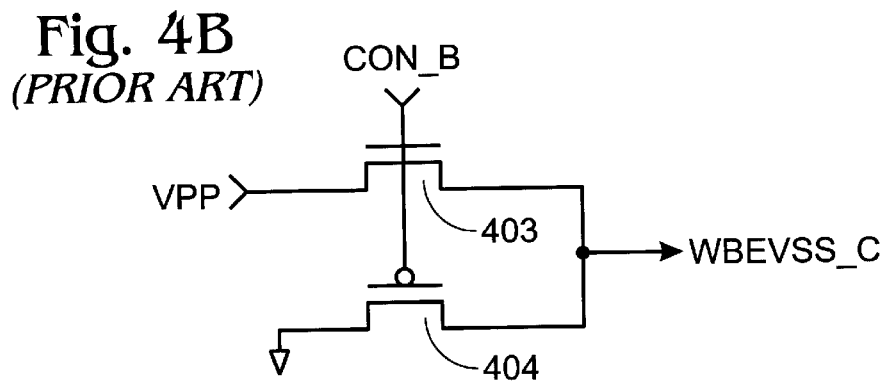
Figure 3:
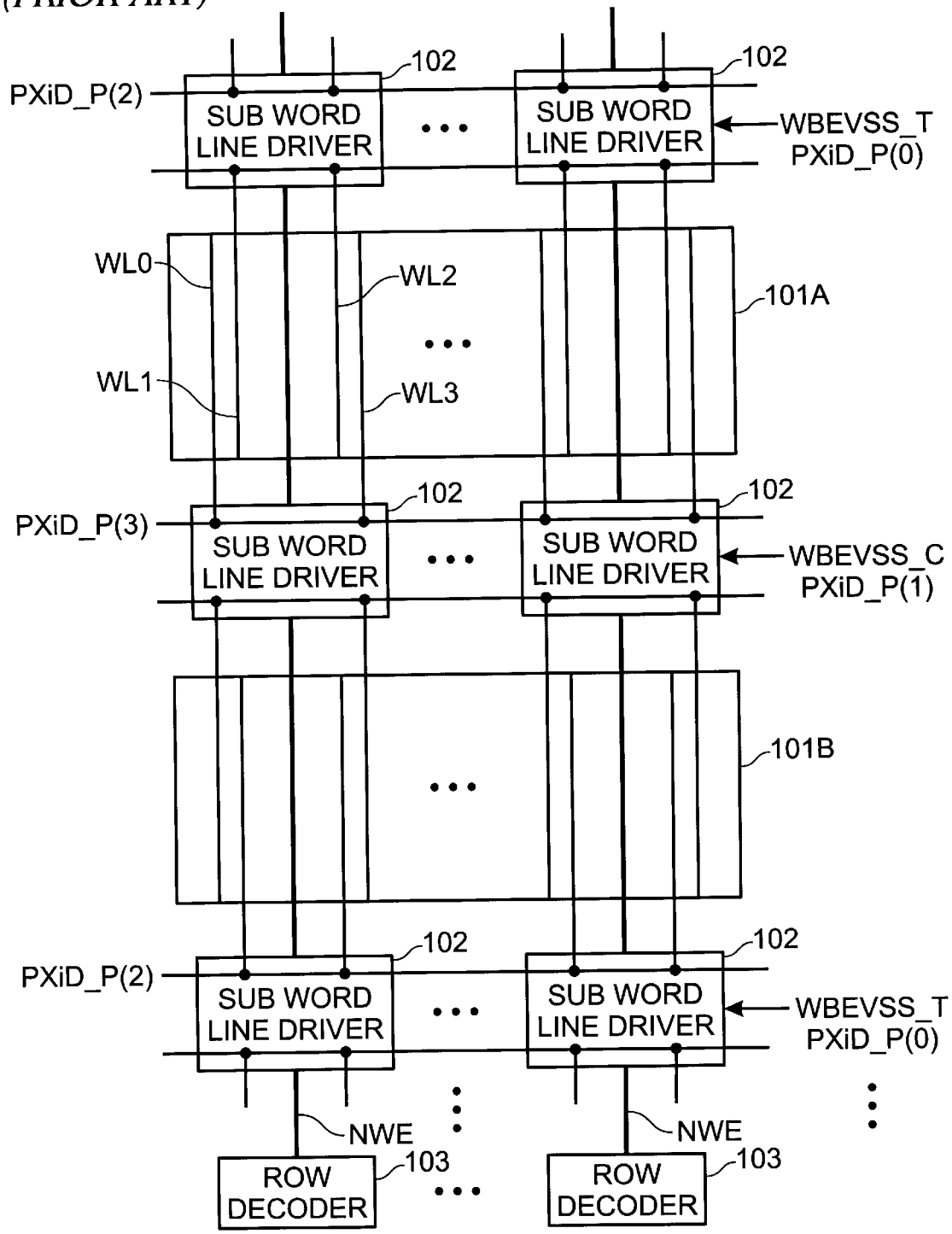
FIG. 3 is a block diagram of another prior art semiconductor memory device showing the connection relationship between sub word line drivers and word lines.
Figure 5:
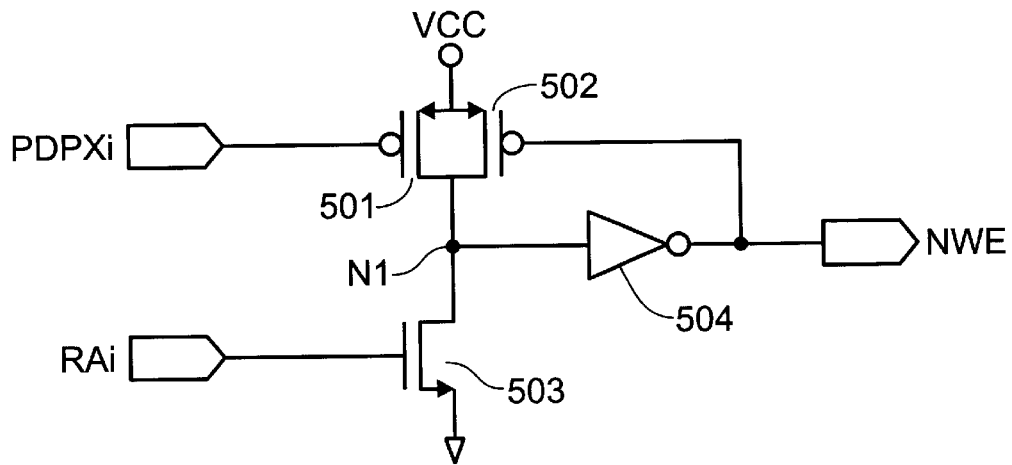
FIG. 5 is a circuit diagram showing a prior art global word line driving circuit.

By using the circuits described in FIG. 8 and 9A through 9B, the word lines WL0–WL3, which are controlled by one global word line NWE, can be independently operated, thereby allowing various background data patterns to be freely written in the memory cells to perform various wafer burn-in tests. The reliability between adjacent memory cells can be efficiently tested by word line activation signals PXiD_P(0)–PXiD_P(3). Therefore, various background data patterns can be used to overcome the problem with the circuit in FIG. 1 in which the stress reliability between the adjacent memory cells can be tested, but the reliability of the bit line can not. The present invention also overcomes the problems with the circuit of FIG. 3 in which the stress reliability between some of the adjacent memory cells cannot be tested.

Figure 6:
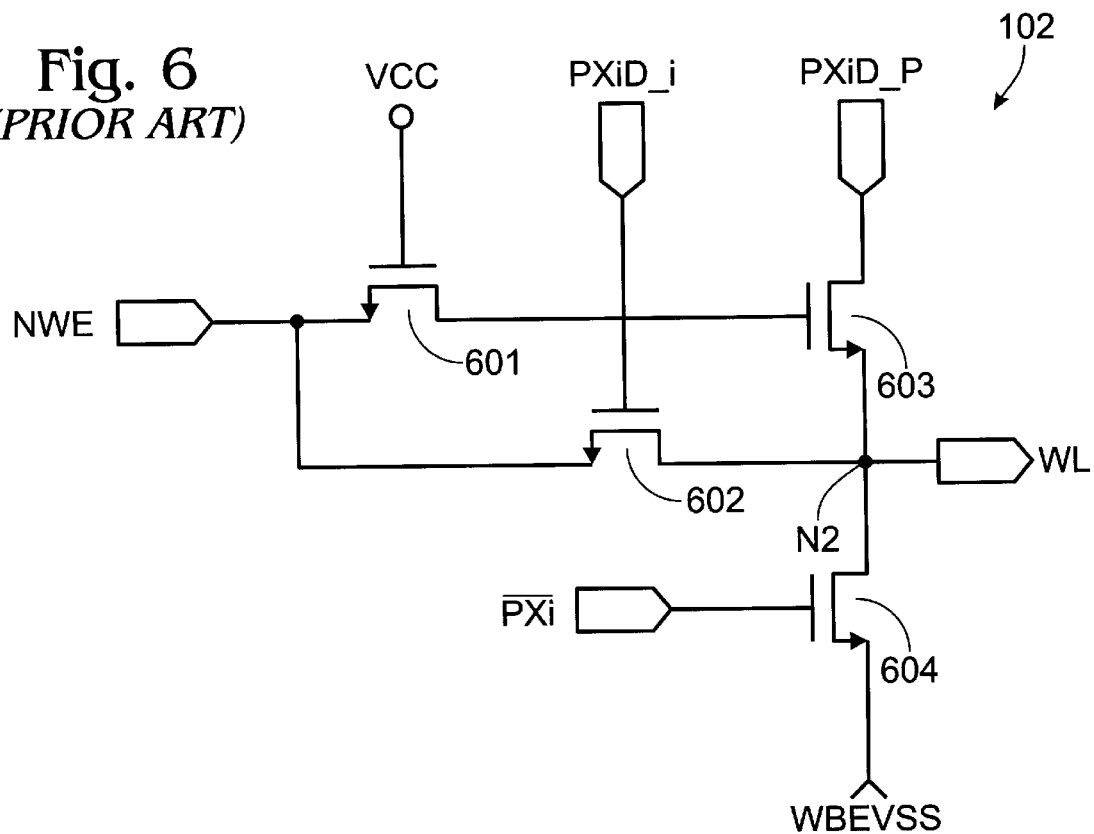
FIG. 6 is a circuit diagram showing a prior all sub word line driver.
Figure 7A:
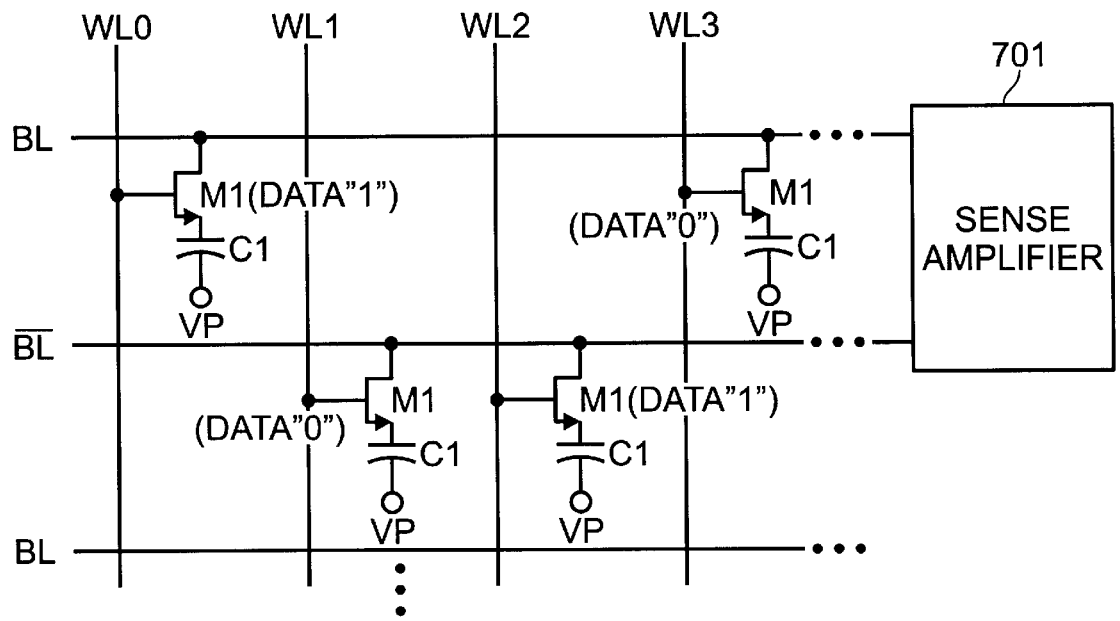
FIGS. 7A and 7B show data patterns after data is written in memory cells in the circuits of FIGS. 1 and 3, respectively.
Figure 7B:
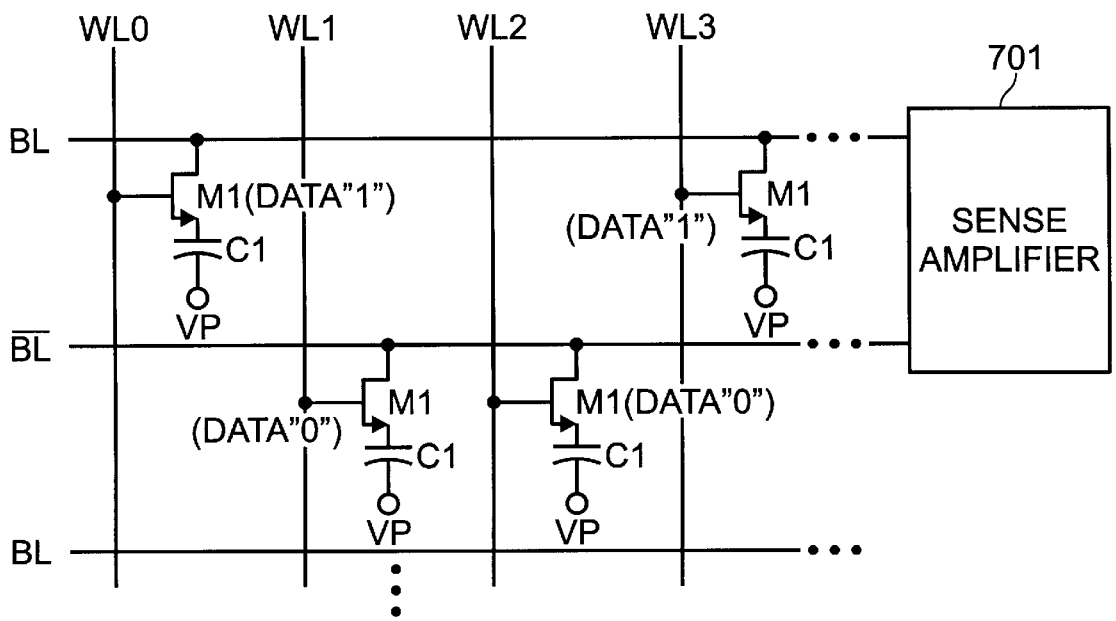

Moreover, in the sub word line driver 102 of FIG. 6, the boosted voltage VPP for activating the word line is not applied to the transistor 604. Instead, by operation of the level transition circuit 928, a sufficient voltage level is supplied to the word line by gate self boosting through the high voltage signal PXiD_P which is applied through the drain of the transistor 603. Consequently, since the transistor 604 does not require a voltage level above the normal level, the above-mentioned problem with breakdown of the transistor 604 is overcome.

As described above, the present invention can form various background write patterns. The write operation can be performed through the sub word line independently connected to each word line, and the transistor to which the high voltage is applied can be prevented from overloading. Furthermore, it is possible to test the reliability of the memory device by alternating current (AC) stress.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A wafer burn-in test circuit for a semiconductor memory device having a plurality of memory cells and a plurality of word lines connected to said memory cells, comprising:
    a first buffer for generating an internal wafer burn-in enable signal in response to an external wafer burn-in enable signal;
    a second buffer coupled to the first buffer for providing a plurality of corresponding row decoding signals in response to said internal wafer burn-in enable signal and to a plurality of row addresses; and
    a plurality of sub word line drivers coupled to the second buffer for supplying a plurality of word line activation signals to corresponding word lines in response to a global word line activation signal, wherein the level of each word line activation signal is changed by the combination of said row decoding signals.

2. A wafer burn-in test circuit as claimed in claim 1, wherein said first buffer includes first and second inverters connected in series.

3. A wafer burn-in test circuit as claimed in claim 1, wherein said second buffer includes:
    a row address controller coupled to said first buffer for generating pulses in response to said internal wafer burn-in activation signal and to said row addresses; and
    a third buffer coupled to said row address controller for generating said row decoding signals in response to said first pulses and to a decoded internal address.

4. A wafer burn-in test circuit as claimed in claim 3, wherein said row address controller includes:
    a first plurality of logic gates, each gate having a first input terminal coupled to receive said internal wafer burn-in activation signal and a second input terminal coupled to receive one of said row addresses; and
    a plurality of inverters, each inverter having an input terminal coupled to the output terminals of one of said first plurality of logic gates.

5. A wafer burn-in test circuit as claimed in claim 4, wherein said first logic gates are NAND gates.

6. A wafer burn-in test circuit as claimed in claim 3, wherein said third buffer includes:
    a second plurality of logic gates, each gate having a first input terminal coupled to receive one of said pulses and a second input terminal coupled to receive one of said decoded internal address; and
    a second plurality of inverters, each inverter having an input terminal coupled to the output terminals of one of said second plurality of logic gates.

7. A wafer burn-in test circuit as claimed in claim 1, wherein said word line activation signal is a high voltage signal for testing said memory cells.

8. A wafer burn-in test circuit according to claim 1 wherein the word lines are driven while the burn-in enable signal is enabled.

9. A wafer burn-in test circuit for a semiconductor memory device having a plurality of memory cells and a plurality of word lines connected to said memory cells, comprising:
    a plurality of sub word line drivers, each sub word line driver coupled to a respective one of the word lines for activating the word line responsive to a global word line signal and a respective one of a plurality of word line activation signals;
    a plurality of transition circuits for generating the plurality of word line activation signals responsive to a plurality of row decoding signals, each transition circuit coupled to a respective one of the sub word line drivers; and
    a row address buffer coupled to the plurality of transition circuits for generating the plurality at row decoding signals responsive to a plurality of address signals;
    wherein each of the plurality of word line activation signals is independently controllable.

10. A wafer burn-in test circuit according to claim 9 wherein the row address buffer includes:
    a row address controller for generating a plurality of pulse signals responsive to the plurality of address signals and a burn-in enable signal, the row address controller having a plurality of input terminals coupled to receive the plurality of address signals and the burn-in enable signal; and a buffer circuit for generating the plurality of row decoding signals responsive to the plurality of pulse signals, the buffer circuit coupled between the row address controller and the plurality of transition circuits.

11. A wafer burn-in test circuit according to claim 10 wherein the burn-in enable signal is an internal burn-in enable signal, and further including an input buffer coupled to the row address controller for generating the internal burn-in enable signal responsive to an external burn-in enable signal.

12. A wafer burn-in test circuit according to claim 11 wherein the internal burn-in enable signal is a CMOS signal and the external burn-in enable signal is a high voltage signal.

13. A wafer burn-in test circuit according to claim 9 wherein each of the transition circuits includes a level transition circuit for boosting the voltage level of the respective word line activation signal.

14. A wafer burn-in test circuit according to claim 9 wherein the word lines are driven while the burn-in enable signal is enabled.

15. A wafer burn-in test circuit for a semiconductor memory device having a plurality of memory cells and a plurality of word lines connected to said memory cells, comprising:

a plurality of sub word line drivers, each sub word line driver coupled to a respective one of the word lines for activating the word line responsive to a global word line signal and a respective one of a plurality of word line activation signals;

means for generating the plurality of word line activation signals responsive to a plurality of row decoding signals; and means for generating the plurality row decoding signals responsive to a plurality of address signals;

wherein each of the plurality of word line activation signals is independently controllable.

16. A wafer burn-in test circuit according to claim 15 wherein the row address buffer includes:

means for generating a plurality of pulse signals responsive to the plurality of address signals and a burn-in enable signal; and means for generating the plurality of row decoding signals responsive to the plurality of pulse signals.

17. A wafer burn-in test circuit according to claim 16 wherein the burn-in enable signal is an internal burn-in enable signal, and further including means for generating the internal burn-in enable signal responsive to an external burn-in enable signal.

18. A wafer burn-in test circuit according to claim 17 wherein the internal burn-in enable signal is a CMOS signal and the external burn-in enable signal is a high voltage signal.

19. A wafer burn-in test circuit according to claim 15 wherein each of the means for generating the plurality of word line activation signals includes means for boosting the voltage level of a respective one of the word line activation signals.

20. A wafer burn-in test circuit according to claim 15 wherein the word lines are driven while the burn-in enable signal is enabled.

\* \* \* \* \*

UNITED STATES PATENT AND TRADEMARK OFFICE
CERTIFICATE OF CORRECTION

PATENT NO. : 5,986,917
DATED : November 16, 1999
INVENTOR(S) : Lee

Page 1 of 1

It is certified that error appears in the above-identified patent and that said Letters Patent is hereby corrected as shown below:

Column 1,
Line 18, "burl-in" should read -- burn-in --.

Column 3,
Line 46, "drivel" should read -- driver --.

Column 4,
Line 1, "which call prevent" should read -- which can prevent --.

Column 5,
Line 26, "prior all" should read -- prior art --.
Line 44, "Refining to" should read -- Referring to --.

Column 6,
Line 7, "tile" should read -- the --.
Line 12, "foul" should read -- four --.

Column 7,
Line 8, "water burn-in" should read -- wafer burn-in --.

Column 8,
Line 56, "plurality at" should read -- plurality of --.

Signed and Sealed this

Thirtieth Day of April, 2002

*Attest:*

*Attesting Officer*

JAMES E. ROGAN
*Director of the United States Patent and Trademark Office*